United States Patent
Shiino et al.

(10) Patent No.: US 7,750,636 B2
(45) Date of Patent: Jul. 6, 2010

(54) NMR SYSTEM

(75) Inventors: Toshiyuki Shiino, Hitachi (JP); Hideo Tsukamoto, Hitachi (JP); Fumio Iida, Hitachi (JP); Mitsuyoshi Tsuchiya, Hitachi (JP)

(73) Assignee: Hitachi, Ltd., Tokyo (JP)

( * ) Notice: Subject to any disclaimer, the term of this patent is extended or adjusted under 35 U.S.C. 154(b) by 200 days.

(21) Appl. No.: 12/016,236

(22) Filed: Jan. 18, 2008

(65) Prior Publication Data

US 2008/0204015 A1 Aug. 28, 2008

(30) Foreign Application Priority Data

Feb. 27, 2007 (JP) ............... 2007-047226

(51) Int. Cl.
*G01V 3/00* (2006.01)
(52) U.S. Cl. ....................... 324/321; 324/318
(58) Field of Classification Search .............. 324/321, 324/318, 322
See application file for complete search history.

(56) References Cited

U.S. PATENT DOCUMENTS

| | | | | |
|---|---|---|---|---|
| 4,859,949 | A * | 8/1989 | McKenna | 324/321 |
| 7,208,954 | B2 * | 4/2007 | Aihara et al. | 324/321 |
| 7,262,600 | B2 | 8/2007 | Kawasaki | |
| 7,271,591 | B1 * | 9/2007 | Legall et al. | 324/320 |
| 7,570,057 | B2 * | 8/2009 | Tsuchiya et al. | 324/318 |
| 2007/0007963 | A1 * | 1/2007 | Kawasaki et al. | 324/321 |
| 2009/0121718 | A1 * | 5/2009 | Yamamoto et al. | 324/322 |

FOREIGN PATENT DOCUMENTS

| | | |
|---|---|---|
| JP | 2004-212354 | 7/2004 |
| JP | 2006-105637 | 4/2006 |
| JP | 2006-292560 | 10/2006 |
| JP | 2007-017391 | 1/2007 |

OTHER PUBLICATIONS

Akutsu et al, "NMR Spectroscopy" Japan Scientific Societies Press, Jan. 31, 2003, pp. 108-109, lines 11-14 (English translation of pertinent portions).
NMR Spectroscopy, Japan Scientific Societies Press, 2003.

* cited by examiner

*Primary Examiner*—Louis M Arana
(74) *Attorney, Agent, or Firm*—Antonelli, Terry, Stout & Kraus, LLP.

(57) ABSTRACT

In NMR system, for preventing a temperature gradient which causes a decrease in S/N ratio from being created in a sample area while suppressing deterioration in homogeneity of a magnetic field, a thermal conductor having high thermal conductivity is disposed in a room-temperature shim coil. The thermal conductor is provided as a coil bobbin, the temperature of the thermal conductor being controlled by a temperature controller using a heat exchanger. Temperature control gas, which is adjusted to a temperature equal to that of the room-temperature shim coil, is fed from the downside of a sample tube, and it is possible to suppress a temperature gradient from being created in a sample area. According to the present invention, since the temperature distribution can be made to be uniform so as to avoid creating a temperature gradient in the sample area while suppressing deterioration of homogeneity in the magnetic field, the NMR spectrum is sharpened so as to improve the S/N ratio.

8 Claims, 2 Drawing Sheets

NMR SYSTEM

FIELD OF THE INVENTION

The present invention relates to sample temperature management of a nuclear magnetic resonance spectrometer (NMR system).

DESCRIPTION OF THE RELATED ART

An improvement in the sensitivity of an NMR system has been prosperously studied and developed. This is because a highly sensitive NMR system could analyze complex molecular structures. Accordingly, the highly sensitive NMR systems have been widely used for both fundamental and advanced studies for pharmaceuticals and proteins. In order to acquire an NMR signal, at first, the nuclear magnetic moment of a sample is aligned with an external magnetic field by the use of a superconducting magnet for generating an external magnetic field and then a Short Rise of radio frequency magnetic field (an RF pulse) is applied to the sample in a direction perpendicular to the external magnetic field by a pick up coil. Thus, the nuclear magnetic moment is inclined in the direction perpendicular to the external magnetic field according to the application of the RF pulse, and when the RF pulse is not applied any more, relaxation phenomena occur in a direction of the external magnetic field. By observing these relaxation phenomena and through Fourier Transform of a received signal, it is possible to acquire an NMR spectrum with a centered nuclear magnetic resonance frequency.

It is required to set a temperature gradient to about 0.1° C./cm over the entire area for the sample from which the NMR spectrum is acquired. Because, since the nuclear magnetic resonance frequency is influenced by a temperature coefficient inherent in a sample, when a temperature gradient is present in the sample area, the temperature gradient locally varies the resonance frequency. As a result, the line width of the NMR spectrum is increased, thereby causing a decrease in S/N ratio (signal noise ratio), that is, a decrease in sensitivity. In addition, when eddy current flows in structures around the sample area, the gradient magnetic field is cancelled, thereby canceling the effect of the application of the gradient magnetic field. If a material with a high magnetic susceptibility is located, an error magnetic field is created in the sample area. Such an error magnetic field increases the line width of the spectrum, resulting in deterioration of the sensitivity.

Non-patent Document 1: "NMR SPECTROSCOPY" written by Hideo AKUTSU, Kazuo SHIMADA, Eiichiro SUZUKI, and Yoshifumi NISHIMURA, Japan Scientific Societies Press, 2003

The sample from which the NMR spectrum is acquired is required to maintain a temperature gradient at about 0.1° C./cm over the entire area. However, if the error magnetic field increases so as to increase the output of a room-temperature shim coil, a temperature gradient is caused in a temperature control gas (i.e. a gas for temperature controlling) in a sample tube according to radiation and convection. As a result, a temperature gradient is caused in the sample area according to heat exchange between the sample tube and the temperature control gas, and accordingly, the line width of the NMR spectrum is increased, thereby causing a deterioration in sensitivity. As disclosed in JP-A-2004-212354, by heating the sample tube with a heater, the temperature gradient can be suppressed. However, in this case, since a structure for supplying power to the rotating sample tube is necessary, there would causes such a risk that the structure is complicated or the heater installed in the sample tube possibly serves as a source of the error magnetic field.

If a gradient magnetic field is applied so as to carry out NMR measurement using a metal as a constituent of the room-temperature shim coil, eddy current flows at the time of application of the gradient magnetic field, resulting in cancellation of the gradient magnetic field, and accordingly, the effect of the application of the gradient magnetic field vanishes away. Further, magnetization of the constituents of the room-temperature shim coil causes an error magnetic field, thereby deteriorating the sensitivity.

BRIEF SUMMARY OF THE INVENTION

An object of the invention is to provide an NMR system having a structure which can solve the above-mentioned problems and which does not create a temperature gradient in the sample area while suppressing deterioration of homogeneity of a magnetic field.

To the end, according to the present invention, there is provided an NRM system including: a superconducting magnet for generating an external magnetic field; a vertical bore arranged in a direction perpendicular to a center axis of the superconducting magnet; a horizontal bore arranged in a direction parallel to the center axis of the superconducting magnet; a sample tube located in the vertical bore; and an NMR probe located in the horizontal bore, for detecting a nuclear magnetic resonance signal from the sample tube, wherein said NRM system further comprises a room-temperature shim coil arranged in the horizontal bore, which is capable of applying a magnetic field at a room temperature, for adjustment of a magnetic field, a temperature control gas for controlling a temperature of a sample area set in the vertical bore, and a thermal conductor provided to the room-temperature shim coil, for controlling a temperature of the room-temperature shim coil.

A combination of a highly thermal-conductive insulator such as aluminum nitride and a metal may be used as a material of the thermal conductor. The metal portion of the thermal conductor may have a rectangular shape.

The present invention can exhibits such a technical effect that the temperature of the room temperature shim coil can be adjusted since the thermal conductor having high thermal conductivity is provided to the room-temperature shim coil. By allowing the temperature control gas the temperature of which is adjusted within a range of ±5° C. of a set temperature of the room-temperature shim coil, to flow from the downside of the sample tube, it is possible to suppress the creation of the temperature gradient in the sample area.

In general, when a metal having high thermal conductivity is used as the thermal conductor, eddy current flows when a gradient magnetic field is applied, resulting in cancellation of the gradient magnetic field. Accordingly, the combination of a high thermal-conductivity insulator such as aluminum nitride and a metal is used as the thermal conductor. The metal portion of the thermal conductor is rectangular so as to be prevented from being continuous in a circumferential direction, thereby it is possible to suppress flowing of eddy current. By combining a material having magnetic susceptibility of a signal opposite to that of the thermal conductor material, with the thermal conductor so that the magnetic susceptibility is zero as a whole, it is possible to suppress the error magnetic field from being created due to the magnetization of the material.

According to the present invention, since the temperature distribution can be made to be uniform so as to avoid creating a temperature gradient in the sample area while suppressing deterioration of homogeneity in the magnetic field, the NMR spectrum is sharpened so as to improve the S/N ratio.

Other objects, features and advantages of the invention will become apparent from the following description of the embodiments of the invention taken in conjunction with the accompanying drawings.

BRIEF DESCRIPTION OF SEVERAL VIEWS OF DRAWINGS

DETAILED DESCRIPTION OF THE INVENTION

Figure 1:
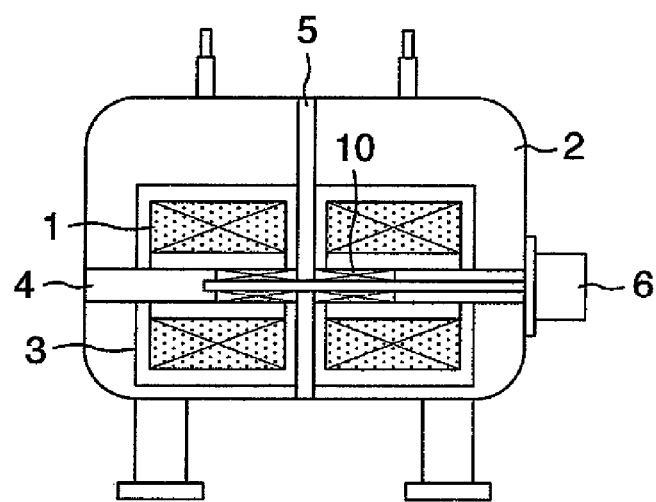
FIG. 1 is a schematic view illustrating an NMR system.

Embodiments of the invention will be described with reference to the drawings. FIG. 1 is a schematic view illustrating an NMR system to which the present invention is applied. A superconducting magnet 1 for generating an external magnetic field is of a split type, for applying a static magnetic field to a sample in order to obtain an NMR signal. The magnitude of the static magnetic field is 7 T when the nuclear magnetic resonance frequency is 300 MHz, and is 14 T when it is 600 MHz. The superconducting magnet 1 is arranged in a liquid helium bath 3 enclosed in a vacuum chamber 2 and is cooled to 4.2 K.

The vacuum chamber 2 has a space called "a cross bore", which includes a cylindrical horizontal bore 4 extended parallel to a center axis of the superconducting magnet 1 which is held at a normal temperature and a cylindrical vertical bore 5 extended, perpendicular to the center axis. An NMR probe 6 for detecting an NMR signal is located in the horizontal bore 4 of the cross bore. A room-temperature shim coil 10 is disposed in the cross bore outside the NMR probe 6.

Figure 2:
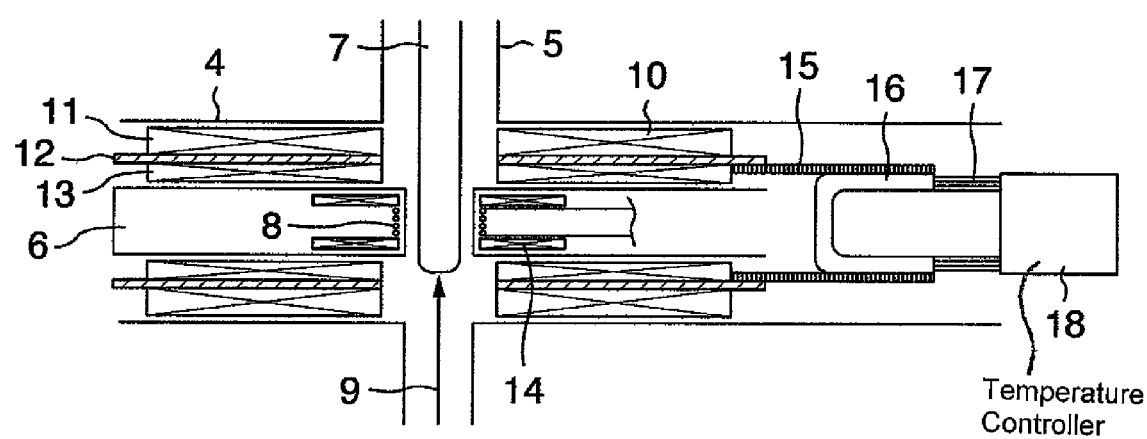
FIG. 2 is a schematic view illustrating a part of the NMR system in the vicinity of a cross bore according to a first embodiment of the present invention.

FIG. 2 is a diagram illustrating a part of the NMR system in the vicinity of the cross bore. A cylindrical pierced portion in which a sample tube 7 is set is formed at an end portion of the NMR probe 6. A pickup coil bobbin is arranged outside the pierced portion and a pickup coil 8 is attached thereto. A detected signal is transmitted to a spectrometer outside the vacuum chamber through a tuning and matching circuit not shown in FIG. 2.

A temperature control gas 9 for adjusting the temperature of a sample area flows from the vertical bore 5 below the sample tube 7. Since adhesion of water drops to the sample area affects an NMR spectrum, it is preferable to use dry nitrogen gas or dry air as the temperature control gas 9.

Although not shown in FIG. 2, a sample spinning system for counteracting an error magnetic field is located in the vertical bore 5 above the sample tube piercing portion of the NMR probe 6. The sample spinning system has such a mechanism that the gas is blown onto a rotor attached to the sample tube so as to rotate the sample tube.

A room-temperature shim coil 10 is provided in the horizontal bore 4, in a concentric manner with the NMR probe 6. The room-temperature shim coil 10 is composed of an axial-symmetry magnetic field creating coil 11 for creating an axial-symmetric magnetic field, an axial-symmetry magnetic field creating coil bobbin 12, and an axial-asymmetric magnetic field creating coil 13 for creating an axial-asymmetry magnetic field. The room-temperature shim coil is arranged outside the NMR probe 6. In this embodiment, the coil bobbin 12 is formed of a thermal conductor.

A gradient magnetic field coil 14 for applying a gradient magnetic field is located inside of a frame for the NMR probe 6. The gradient magnetic field coil 14 is coaxial with the horizontal bore 4, but may be coaxial with the vertical bore or may have various shapes and arrangements depending on a use thereof.

The wire material of the axial-symmetry magnetic field creating coil 11 of the room-temperature shim coil 10 is wound on the cylindrical coil bobbin 12. The coil bobbin should be formed of a high-thermal-conductivity material in order to adjust the temperature of the room-temperature shim coil 10. In view of this point, it may be considered that the coil bobbin is formed of a metal material. However, should a cylindrical metal material be used, eddy current would be created upon application of the gradient magnetic field, resulting in cancellation of the gradient magnetic field effect. Accordingly, an insulator material having a high thermal conductivity and a high electrical resistance such as, for example, aluminum nitride, is suitably used as a material of the axial-symmetry magnetic field creating coil bobbin 12. Since it is difficult to uniformly adjust a temperature to a predetermined temperature with the use of only the bobbin made of the insulator, a temperature controlling assistant component made of a metal such as copper or aluminum having high thermal conductivity is used.

Figure 3:
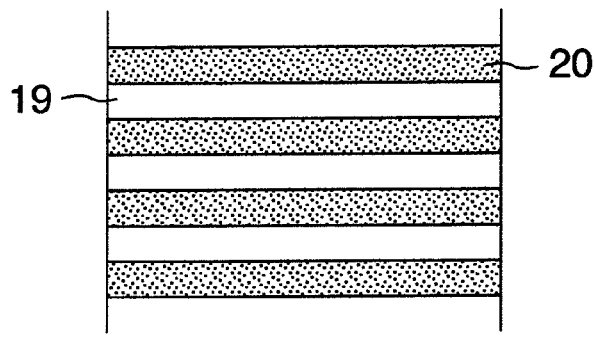
FIG. 3 is a developed view illustrating a thermal conductor.

FIG. 3 is a development view illustrating the thermal conductor which also serves as the coil bobbin. In order to suppress the eddy current, the thermal conductor 12 is provided with a high-thermal-conductivity metal 20 in a rectangular shape on a high-thermal-conductivity insulator 19 so as to have an intermittent structure which is circumferentially not continuous. The thermal contact between the insulator 19 of the coil bobbin 12 and the high-thermal-conductivity metal 20 can be made by bonding them with the use of an epoxy resin while the room-temperature shim coil 10 is impregnated therewith. The temperature of the room-temperature shim coil 10 can be kept uniform by the thermal conductor 12 in which the coil bobbin formed of the insulator and the rectangular metal are combined.

Figure 4A:
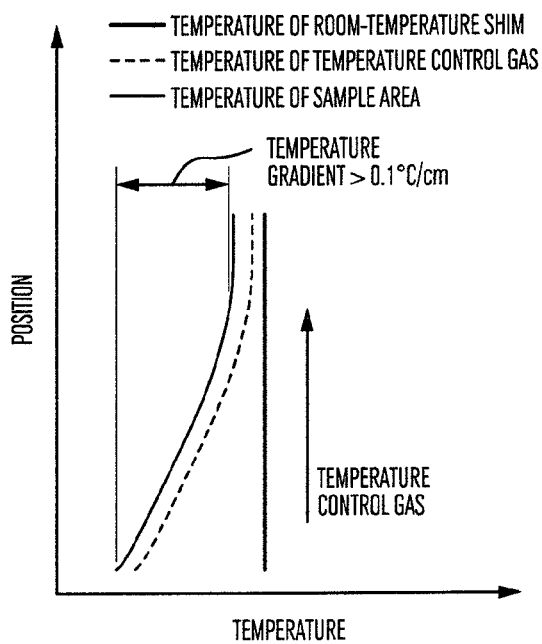
FIG. 4A is a schematic diagram illustrating a temperature distribution of a sample area in the related art.
Figure 4B:
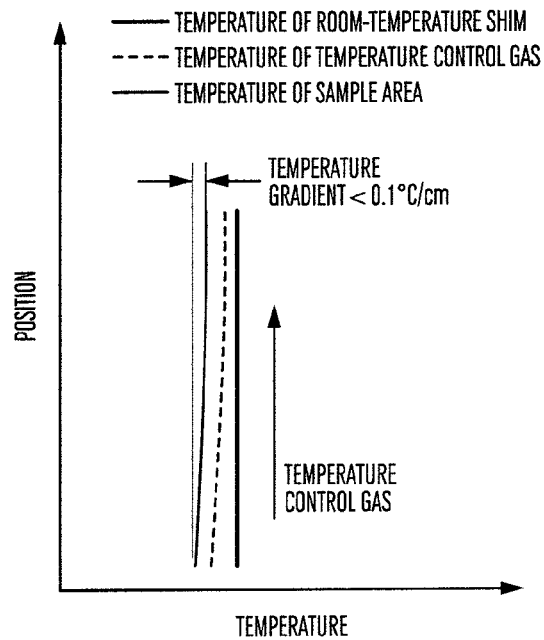
FIG. 4B is a schematic diagram illustrating a temperature distribution of a sample area in the invention.

FIGS. 4A and 4B are schematic diagrams illustrating a temperature distribution. In the related art shown in FIG. 4A, when a gas adjusted to a desired sample temperature is allowed to flow from the downside of the sample tube, the temperature of the temperature control gas gradually approaches the temperature of the room-temperature shim coil 10 by means of radiation and convection. As a result, a gradient not less than 0.1° C./cm is created in the temperature distribution of the sample area, resulting in an increase in a spectrum line width.

On the other hand, in the embodiment of the invention shown in FIG. 4B, the temperature of the room-temperature shim coil 10 is adjusted while allowing a gas adjusted to substantially the same temperature as that of the room-temperature shim coil to flow, and thus, the temperature gradient is not created in the temperature control gas, resulting in suppression of creating the temperature gradient in the sample area.

As shown in FIG. 2, the thermal conductor 12 extends to a position where eddy current does not affect the sample space, and the metal temperature-control assistant component 20 of the thermal conductor 12 is made in thermal contact with a heat exchanger 15 by means of brazing or soldering at the end portions. The heat exchanger 15 is a cylindrical component formed of a high-thermal-conductivity metal such as copper or aluminum and is made into thermal contact with a heat exchanger pipe 16 by means of brazing or soldering. In order to enhance the heat exchange efficiency between the heat exchanger pipe 16 and the heat exchanger 15, the heat exchanger pipe 16 is extended as long as possible.

Circulating antifreeze whose temperature is controlled is used for the temperature control of the thermal conductor 12, in order to make the sample temperature below zero. The heat exchanger pipe 16 having is a portion of a tube through which the circulating antifreeze whose temperature is controlled flows, making contact with the heat exchanger 15, is suitably formed of a copper pipe having high thermal conductivity. A temperature controller 18 having a pump is used for the adjustment of temperature and the circulation of the antifreeze.

For example, a temperature-controlled water circulating system can be used as the temperature controller 18. The circulating antifreeze whose temperature is adjusted by the temperature controller 18 is introduced into the heat exchanger pipe 16 from the pipe outside the vacuum chamber and is returned to the temperature controller 18 after heat exchange. For the suppression of creation of the error magnetic field, nonmagnetism antifreeze can be preferably used as the circulating antifreeze. The temperature adjusting range can be set to a value in a range from −30° C. to 80° C. A vinyl hose or Teflon (registered trademark) hose may be used as a circulating antifreeze pipe 17 between the temperature controller 18 and the heat exchanger pipe 16. Nonmagnetism metal such as stainless steel may be used for the pipe, but the material may be magnetized due to the fringing field of the superconducting magnet 1 and may be subjected to magnetic force. Accordingly, since the leakage of the circulating antifreeze may occur, it is preferable that the metal is not used.

Though depending on a mode of a magnetic field to be created, the axial-asymmetric magnetic field creating coil 13 may be formed, for example, by attaching a copper printed board sheet formed by etching or the like to the inner periphery of the thermal conductor 12.

The temperature adjustment of the temperature control gas is performed by allowing a temperature-control-gas temperature controller, which is not shown in FIG. 2, to circulate antifreeze for the temperature control gas so as to perform the heat exchange with the gas in the temperature-control-gas heat exchanger arranged outside the vacuum chamber 2 below the vertical bore 5. The temperature-control-gas temperature controller may be separated from or identical with the temperature controller 18. When they are identical with each other, it is possible to allow the temperature of the room-temperature shim coil 10 to approach the temperature of the temperature control gas 9 with a high degree of precision, thereby suppressing the temperature gradient.

It is considered that a method of measuring the temperatures of the sample tube 7 and the room-temperature shim coil 10 and performing the feedback with the use of the PID control is suitable for the temperature control method. However, it is not preferable that a thermometer is arranged in the vicinity of the sample area since it causes a decrease in homogeneity of a magnetic field. In this embodiment, on the basis of the experimental result such that the NMR spectrum is not affected if a temperature T1 of the room-temperature shim coil 10 set by a temperature-controller and a temperature T2 of the temperature control gas 9 set by a temperature-controller satisfy the relation of |T1-T2|<5° C., T1 and T2 are always kept constant.

Due to the magnetization of the coil bobbin 12 of the room-temperature shim coil 10, in particular, the temperature controller assistant component 20 made of metal, an error magnetic field would be created in the sample area to deteriorate the SN ratio. In order to prevent the deterioration, for canceling the magnetization created by the insulator 19 of the thermal conductor 12 or the temperature-control assistant component of the high-thermal-conductivity metal 20, a material having magnetic susceptibility of the opposite sign is combined. If aluminum nitride is used for the coil bobbin material and copper is used for the temperature-control assistant component 20, diamagnetism would be caused. Accordingly, a paramagnetism sheet is attached to the thermal conductor 12 so that the magnetic susceptibility of the thermal conductor 12 becomes 10% or less of that of copper. Examples of the paramagnetism member include high-purity aluminum, aluminum alloy, titanium, tantalum, tungsten, niobium and the like.

It is preferable that the magnetic susceptibility of the compound material is measured by the SQUID (Superconducting Quantum Interference Device) fluxmeter for measuring magnetic susceptibility with high sensitivity and a sectional area ratio is determined on the basis of the measured magnetic susceptibility. Further, if the magnetic susceptibility of the sectional piece of the compound member is measured by the SQUID fluxmeter and it is confirmed that it is 10% or less of the magnetic susceptibility of copper, it is possible to substantially completely suppress the error magnetic field from being created in the sample area. It is preferable that the aluminum nitride or the paramagnetism member is formed of a material as high in purity as possible. That is, if the purity is high, the dependency of magnetization on a magnetic field is linear according to orbital diamagnetism of aluminum nitride or copper, and according to Pauli paramagnetism of aluminum or tantalum. On the contrary, if impurities are mixed, the magnetization curve is not linear but indicates Curie paramagnetism or saturation magnetization, thereby making it difficult to predict the magnetization in a high magnetic field. As a result, the cancellation of magnetization in a high magnetic field becomes impossible.

Figure 5:
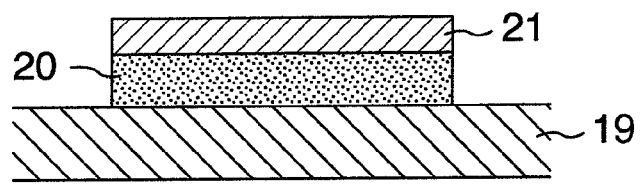
FIG. 5 is a cross-sectional view illustrating a thermal conductor.

The paramagnetism sheet is attached to the rectangular metal 20 in order to be prevented from being continuous in the circumferential direction, thereby it is possible to prevent the eddy current from flowing. FIG. 5 is a cross-sectional view illustrating an example thereof. The rectangular high-thermal-conductivity metal 20 is attached to the high-thermal-conductivity insulator 19 and a paramagnetism metal 21 is attached thereto. If aluminum nitride and copper are used for the coil bobbin while tantalum is used for the paramagnetism member, the volume ratio of aluminum nitride and copper being set to about 2:1, and a ratio of tantalum to copper being set to about 0.2, it is possible to set the magnetic susceptibility to 10% or less of the magnetic susceptibility of copper.

If the magnetization of the room-temperature shim coil 10 causes a problem, a copper and aluminum wire or a copper and tantalum wire may be used to as the wire member of the axial-symmetry magnetic field creating coil 11 so as to set the magnetic susceptibility to be zero. A sheet made of a material for canceling the magnetic susceptibility may be attached to the sheet of the non-axial-symmetry magnetic field creating coil 13.

In general, since a glass tube not having high thermal conductivity is used as the sample tube 7, the temperature gradient can be easily created. In order to make the temperature distribution of the sample area more uniform, it is preferable that a good thermal conductor is used as a material of the sample tube. Since a metal sample tube deteriorates the homogeneity of a magnetic field, a material having a zero magnetic susceptibility, which is composed of aluminum and copper or tantalum and copper, can be suitable used as the material of the sample tube. Since copper or aluminum is a good thermal conductor, it is possible to obtain the homogeneity in temperature distribution of the sample area.

The above-mentioned NMR system according to the invention can be used for a high sensitivity nuclear magnetic resonance spectrometer and a magnetic imaging system.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. An NMR system comprising:
a superconducting magnet for generating an external magnetic field;
a vertical bore extended in a direction perpendicular to a center axis of said superconducting magnet;
a horizontal bore extended in a direction parallel to the center axis of said superconducting magnet;
a sample tube disposed in said vertical bore;
an NMR probe disposed in said horizontal bore, for detecting a nuclear magnetic resonance signal from said sample tube;
a room-temperature shim coil located in said horizontal bore, capable of applying a magnetic field for adjustment of a magnetic field at a room temperature;
a temperature control gas for adjusting a temperature of a sample area set in said vertical bore; and
a thermal conductor disposed in said room-temperature shim coil so as to control a temperature of said room-temperature shim coil by a temperature controller.

2. The NMR system according to claim 1, wherein antifreeze of which a temperature is adjusted by said temperature controller is circulated and the temperature of said room-temperature shim coil is adjusted through heat exchange between said antifreeze and said thermal conductor.

3. The NMR system according to claim 1, wherein said temperature control gas of which a temperature is adjusted within a range of ±5° C. of a set temperature of said room-temperature shim coil is made to flow so as to adjust the temperature of the sample area.

4. The NMR system according to claim 1, wherein a combination of a material having high thermal conductivity and high resistance and a metal material is used as a material of said thermal conductor.

5. The NMR system according to claim 1, wherein a metal portion of said thermal conductor is not continuous, that is, intermittent, in a circumferential direction.

6. The NMR system according to claim 1, wherein magnetic susceptibility of said thermal conductor is 10% or less of magnetic susceptibility of copper by mixing a material having magnetic susceptibility of a signal, which is opposite to the sign of the magnetic susceptibility of said thermal conductor, into said thermal conductor.

7. The NMR system according to claim 1, wherein a temperature of said thermal conductor is adjusted with a use of nonmagnetism antifreeze.

8. The NMR system according to claim 1, wherein said thermal conductor serves as a bobbin of said room-temperature shim coil.

* * * * *